United States Patent [19]

Bean et al.

[11] 4,434,537
[45] Mar. 6, 1984

[54] INTEGRAL LATCHING MECHANISM FOR MODULE FRONT PLATE

[75] Inventors: Thomas R. Bean, Concord; Edward F. Stockmaster, Mentor; George S. Whaley, Eastlake, all of Ohio

[73] Assignee: The Babcock & Wilcox Company, New Orleans, La.

[21] Appl. No.: 284,262

[22] Filed: Jul. 17, 1981

[51] Int. Cl.³ .......................... G12B 9/00; H05K 1/14; H05K 7/12
[52] U.S. Cl. ...................................... 24/380; 24/305; 248/27.3; 248/221.3; 361/395; 361/399
[58] Field of Search .................. 24/377, 380, 155 SD, 24/201 A, 201 C, 305; 402/62, 63; 248/27.3, 221.3, 221.4, 73, DIG. 6; 361/415, 399, 395

[56] References Cited

U.S. PATENT DOCUMENTS

| | | | |
|---|---|---|---|
| 3,066,367 | 12/1962 | Garman | 248/221.3 |
| 3,191,097 | 6/1965 | Dano et al. | 361/415 |
| 4,219,172 | 8/1980 | Murayama | 248/27.3 |

FOREIGN PATENT DOCUMENTS 197808 8/1978 Canada ............................. 361/415

Primary Examiner—Robert P. Swiatek
Assistant Examiner—John G. Weiss
Attorney, Agent, or Firm—James C. Simmons; D. Anthony Gregory; Robert J. Edwards

[57] ABSTRACT

A latching mechanism for latching the front plate of a circuit board module to the circuit board module rack effected by merely inserting the module in the rack. The mechanism includes a resilient tab having a prong with a tapered head. The prong mates with an aperture of a mount on the rack such that at full insertion of the module the head engages the mount through the aperture thus precluding withdrawal of the module from the rack. Depressing the resilient tab allows withdrawal of the prong from the mount through the aperture to unlatch the mechanism and permit withdrawal of the module from the rack.

11 Claims, 12 Drawing Figures

INTEGRAL LATCHING MECHANISM FOR MODULE FRONT PLATE

BACKGROUND

The present invention relates to latching devices and in particular to a device for latching a circuit board module to its mounting rack.

Complex and large electric circuit networks such as systems control networks for ships or nuclear reactors are typically broken down into a plurality of small circuits each mounted on a modular circuit board. The circuit boards, which are electrically interconnected to make up the network, enable fast and easy replacement of failed circuit parts as well as greater flexibility of design.

Circuit boards are typically rectangular and mounted vertically in racks. Generally, the top and bottom edges of the boards slide in tracks and the back edge is equipped with some electrical connector means.

The front of the circuit board module is equipped with a plate for handling, identification and asthetic purposes. Also some mechanism is typically provided to lock the circuit board module to the circuit board rack. This is desired to prevent withdrawal of the module and thereby breaking of the circuit network in the event of some withdrawal force being applied to the circuit board by accident, e.g., earthquakes, vibrations, sudden ship reeling movements or jarring by the end of a janitor's mop handle. The present invention is such a latching mechanism.

One known prior art latching mechanism is the screw type. A machined screw extends through the front plate of the module and threadingly engages a threaded hole on the rack. The shortcomings of the screw type include the necessity of manufacturing, stocking and assembling costly machined parts and the need to employ a separate tool to assure a positive and lasting engagement.

Another known prior art latching mechanism is the plunger type wherein a plunger is slidably disposed in an expandable sleeve attached to the front plate. Upon insertion of the modular circuit board into the rack, the sleeve penetrates a hole provided therefor. Once so positioned, forcing the plunger through the sleeve expands the sleeve to a dimension greater than that of the hole and thereby effecting a latch, to preclude withdrawal of the sleeve through the hole. The shortcomings of the plunger type include stocking and assembly costs, the fact that currently there is but a single source of supply for this particular device and the ability to completely insert the circuit board module into working position in the rack without actually effecting the latch.

SUMMARY OF THE INVENTION

The present invention overcomes the disadvantages of the prior art latching mechanisms by providing a mechanism integral to the front plate, eliminating separate parts and insuring positive lasting engagement automatically by merely fully inserting the module. No tools or further actions beyond mere insertion are required. Moreover, the integral mechanism dimensions are such that it can directly replace the plunger type mechanism.

The integral mechanism includes a prong having a shaft ending in a head tapered to a point. The prong is resiliently mounted to the circuit card module front plate and is aligned with a hole on the circuit card module rack. As the card is inserted into the rack the tapered surface of the prong near the point thereof engages the edge of the hole. Further insertion of the card forces the resilient mounting means to deflect as the tapered surface bears against the hole edge.

Upon the head being completely inserted through the hole, the resilient means urges the prong back toward its original position thus latching the head behind the mount plate. The module may be unlatched by positioning the prong head in alignment with the hole and withdrawing the circuit board module and thus the integrated latching prong head from the mount plate hole.

It is an object of the present invention to provide a latching mechanism for a modular circuit board.

It is a further object of the invention to provide a latching mechanism for a modular circuit board which is integral with the circuit board module front plate.

It is another object of the invention to provide a latching mechanism with the foregoing advantages and which eliminates the use of a plurality of parts.

It is yet another object of the invention to provide a latching mechanism with the foregoing advantages and which eliminates the requirement of tools to effect the latch.

It is a further object of the invention to provide a latching mechanism with the foregoing advantages and which insures positive latching engagement automatically by merely inserting the module into its rack.

Other objects and advantages of the present invention will become readily apparent from the following description and drawings which illustrate a preferred embodiment of the present invention.

DETAILED DESCRIPTION OF THE PREFERRED EMBODIMENT

Figure 1:
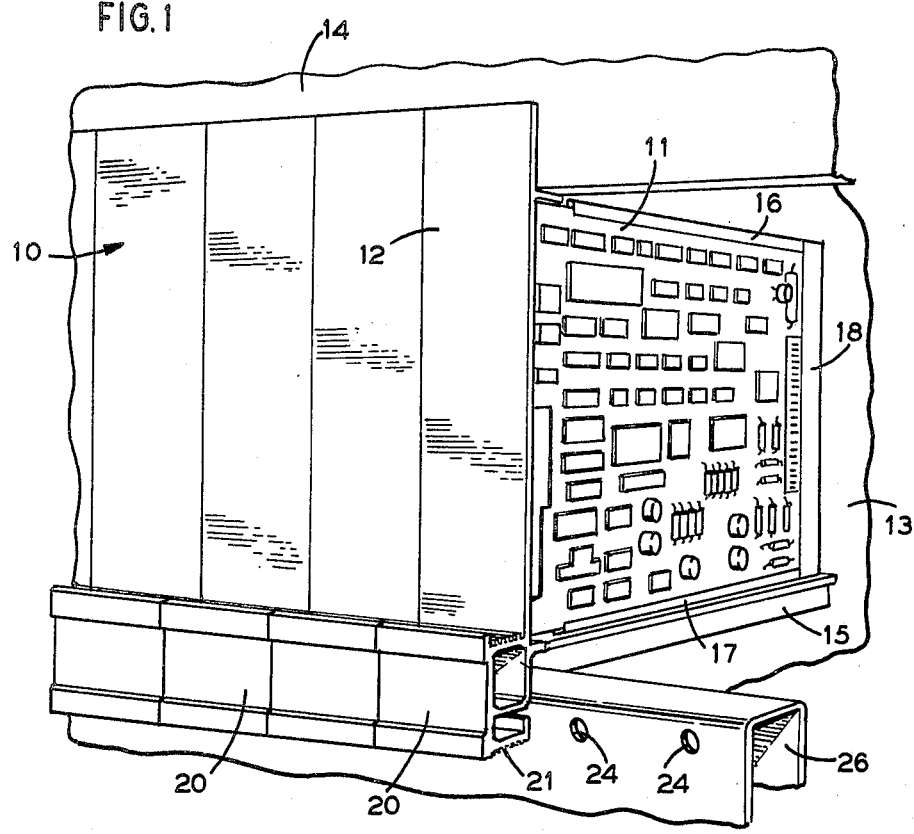
FIG. 1 is a perspective view of circuit board modules incorporating the latching mechanism of the preferred embodiment of the present invention in position in a circuit board rack.

Refer now to FIG. 1 there being shown a plurality of circuit board modules, generally referred to by reference numeral 10, incorporating the preferred embodiment of the latching mechanism according to the present invention. Circuit board modules 10 are shown in position in circuit board module rack 14. Rack 14 may be of any suitable construction which provides the following essential features: (1) Circuit board module alignment, this is illustrated by upper and lower tracks 16 and 17 respectively. (2) Circuit board module support, this is illustrated by support beam 15 extending between module mount 26 and rack back wall 13. (3) Electrical connection plugs 18 (only one in view) provide for electrical interconnection of the circuit board modules.

Modular front plate 12 is molded from a polycarbonate base resin. Number 940 clear LEXAN (a registered trademark of General Electric Company) is used in the preferred embodiment. This material provides sufficient strength for support and resiliency for operation of the latch as described in more detail below. Tint or coloring may be added to the resin as desired for aesthetic effect.

Also shown in FIG. 1 are latch apertures 24 of mount 26. An aperture 24 is provided for each circuit board module 10.

Figure 2:
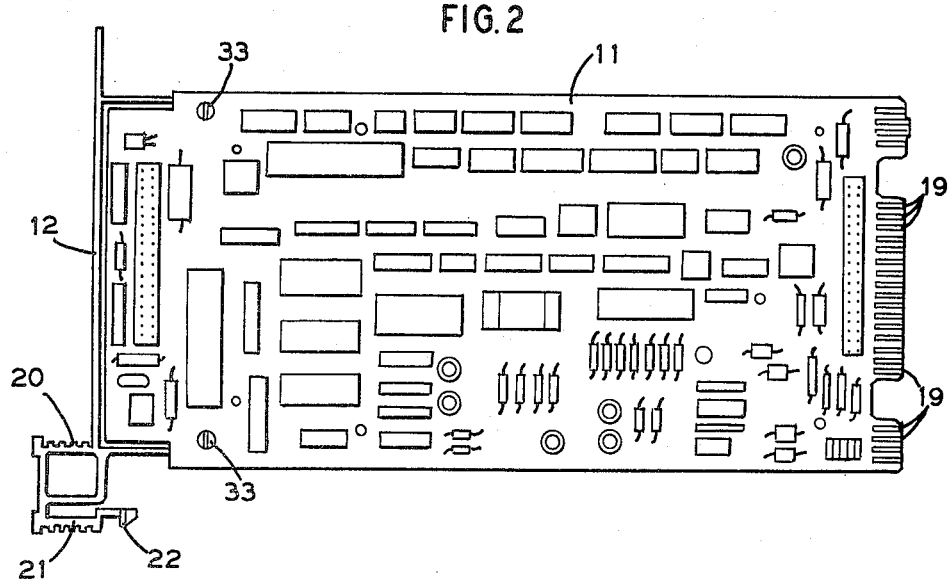
FIG. 2 is a right side view of the module of FIG. 1.

Refer now to FIG. 2 there being shown a side view of a circuit board module 10 of FIG. 1. Circuit board 11 is secured to plate 12 by screws 33. Electrical connectors 19 provide electrical interface with plug 18. Front plate 12 includes latch block 20, arm tab 21 and prong 22 as well as other parts, all molded in one piece from LEXAN. Front plate 12 is described in more detail below.

Figure 3:
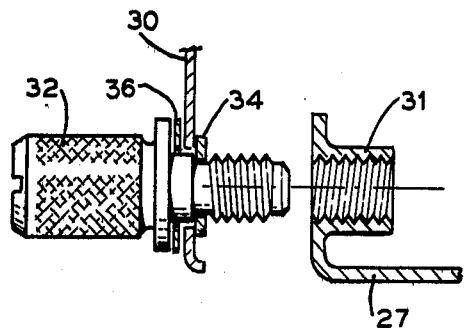
FIG. 3 is a partial cutaway view of a prior art screw type latching mechanism for a module circuit board.

Refer now to FIG. 3 there being shown a screw type latching mechanism of the prior art. Machined screw 32 is held in circuit board module front plate 30 by c-clip 34 and threadingly engages threaded-bore 31 of module mount 27. Bearing washer 36 is provided to prevent marring of plate 30. As discussed above, the disadvantages of this arrangement include the necessity of manufacturing, stocking and assembling costly machined parts and the need to employ a separate tool, e.g., screw driver, allen wrench, to assure a positive and lasting engagement.

Figure 4:
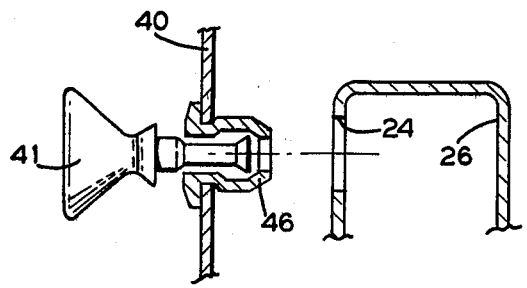
FIG. 4 is a partial cutaway view of a prior art plunger type latching mechanism for a modular circuit board.
Figure 5:
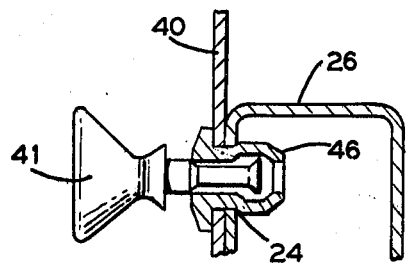
FIG. 5 is a view like FIG. 4 showing the module in the fully inserted position with the plunger type latching mechanism not engaged.
Figure 6:
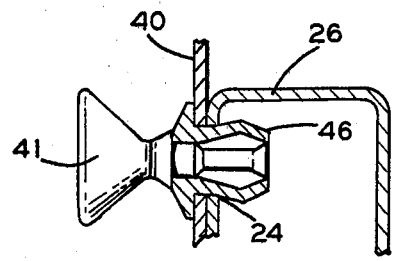
FIG. 6 is a view like FIG. 5 showing the plunger type latching mechanism engaged.

FIGS. 4, 5 and 6 illustrate a plunger type latching mechanism of the prior art. FIG. 4 shows the position of module front plate 40 before the circuit board module is fully inserted into the circuit board module rack. Expander 46 extends through circuit board module front plate 40 and is in alignment with aperture 24 of module mount 26. In FIG. 5 the circuit board module is fully inserted, expander 46 is in position in aperture 24, however, no latch is effected. In FIG. 6, plunger 41 is inserted thereby expanding expander 46 to a dimension greater than aperture 24 to effect the latch. As noted above the disadvantages of the plunger type latching mechanisms include stocking and assembling costs, the fact that there is but a single source of supply for this particular device and the ability to completely insert the circuit board module into working position in the rack without actually effecting the latch, thus enabling accidental withdrawal.

Figure 7:
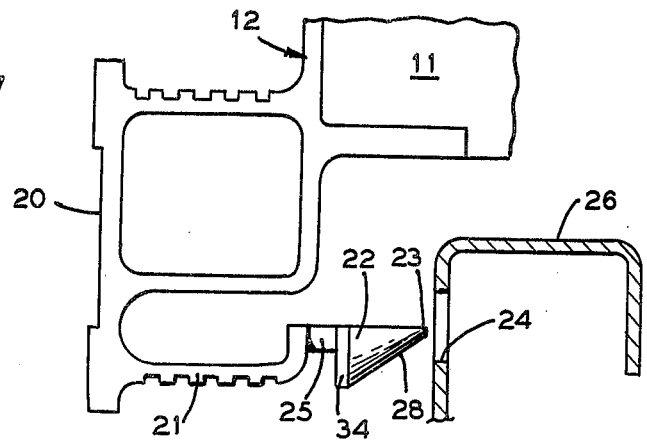
FIG. 7 is a partial cutaway view of the integral latching mechanism for a modular circuit board according to the preferred embodiment of the present invention.

Refer now to FIG. 7, there being shown the preferred embodiment of the integral latching mechanism according to the invention. Circuit board 11 mounted on module front plate 12 of circuit board module 10 is shown in a not fully inserted position in rack 14. Latch block 20 is integral with and protrudes from the lower portion of front plate 12 and serves to provide a finger hold for withdrawing module 10 from rack 14. Latch tab 21 extends from latch block 20 toward the rear and toward module mount 26 of rack 14. Prong 22 extends from latch tab 21 also in the rear direction. Prong 22 includes a shaft portion 25 extending between tab 21 and prong shoulder 34 and a tapered head 28 between shoulder 34 and tip 23.

Figure 8:
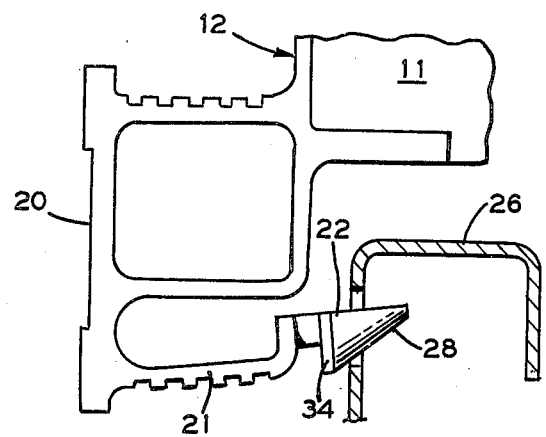
FIG. 8 is a view like FIG. 7 showing the latching means partially engaged.

Referring now to FIG. 8, with module 10 in tracks 16 and 17 prong 22 is aligned such that upon inserting module 10 tapered head 28 of prong 22 bears upon the lower edge of aperture 24 of module mount 26. Shoulder 34 is diametrically smaller than aperture 24 to enable passage of prong 22 therethrough.

Figure 9:
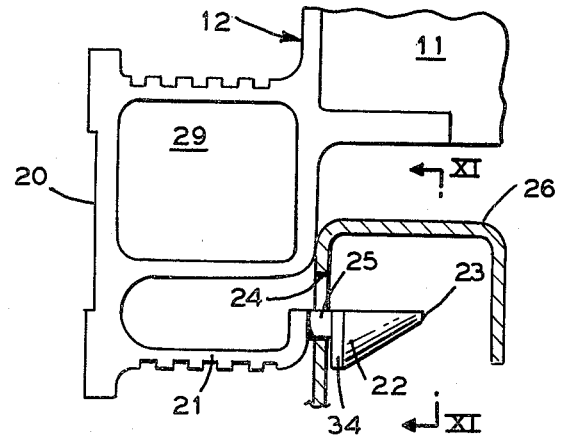
FIG. 9 is a view like FIG. 7 showing the latching mechanism fully engaged.

Refer now to FIG. 9 upon full insertion of module 10 into rack 14, whereupon connectors 19 mate with plug 18, shoulder 34 has completely traversed aperture 24 and shaft 25 lies through aperture 24. As discussed above, in the preferred embodiment the front plate material is chosen such that tab 21 provides the requisite resiliency to elastically bend as the edge of aperture 24 bears upon tapered head 28 and to rebound to its original position as shoulder 34 clears aperture 24. Once tab 21 has rebounded, the latch is effected as shoulder 34 interfacing with module mount 26 will preclude withdrawal of module 10 from rack 14.

Figure 10:
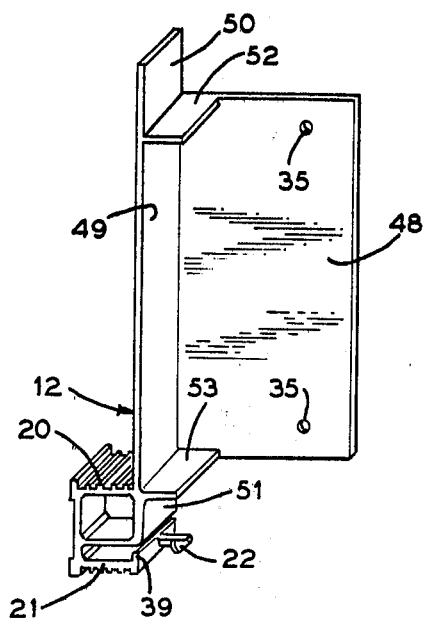
FIG. 10 is a perspective view of the module front plate incorporating the latching mechanism of the preferred embodiment of the present invention.

Refer now to FIG. 10, there being shown a perspective view of front plate 12 of module 10 absent circuit board 11. Front plate 12 is form molded in one piece and includes all the parts shown in FIG. 10. Front wall 49 of front plate 12 is oriented perpendicular to side wall 48. Circuit board 11 (See FIG. 2) is attached flush to side wall 48 by screws 33 and screw holes 35. Upper gusset 52 and lower gusset 53 provide support to maintain the perpendicular relationship of front wall 49 and side wall 48. Latch block 20 extends from front wall lower portion 51 of front wall 49 towards the front thereof at and below lower gusset 53. Latch tab 21 extends below block 20 from the front lower edge thereof towards the rear ending in tab lip 39. Prong 22 extends below gusset 53 from tab lip 39 towards the rear.

Figure 11:
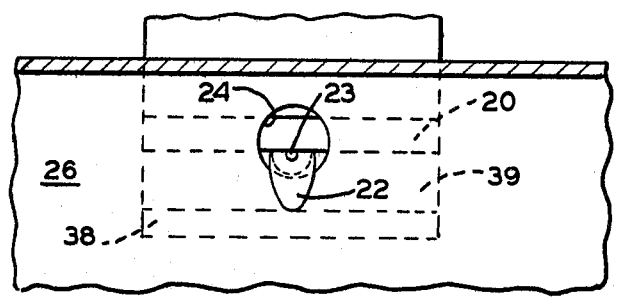
FIG. 11 is a section view taken along lines XI—XI of FIG. 9.

Refer now to FIG. 11, a rear view of prong 22 being shown therein. In this view the latching mechanism is in the latched position with prong 22 extending through hole 24 and engaging mount 26. Tab lip 39 and lower lip 38 of latch tab 21 are shown in phantom.

Figure 12:
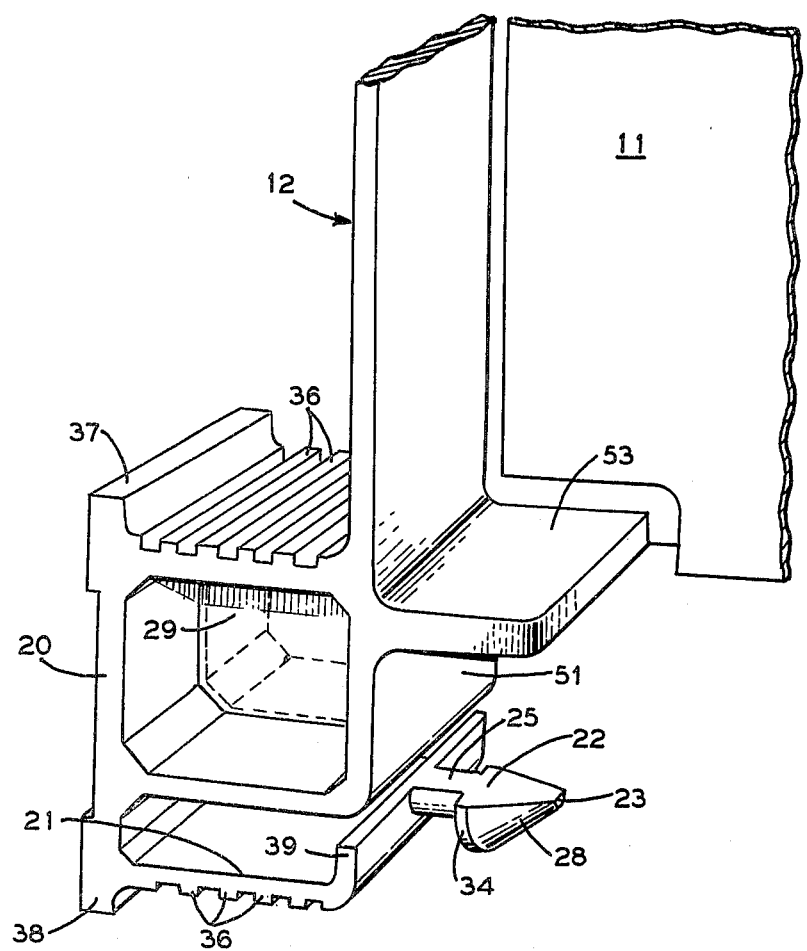
FIG. 12 is a detailed perspective view of the latching mechanism of the preferred embodiment of the present invention.

FIG. 12 illustrates in more detail further salient features of the latching mechanism of the preferred embodiment. Latch block 20 is hollow and provided with latch block support gusset 29 for strength. Upper lip 37 and lower lip 38 along with grip treads 36 provide finger and thumb holds for squeezing latch tab 21 toward latch block 20 and for withdrawing module 10 from rack 14.

The preferred embodiment of the invention as described above was formed in one piece from Number 940 clear LEXAN. However, the invention is not limited thereto, and may be formed in any suitable number of pieces or from any material or combination or materials as required or desired in a particular circumstance.

For simplicity in the preferred embodiment the resiliency of tab 21 is provided by the resiliency of the specific material from which tab 21 is formed. However, the invention is not limited thereto and other means, e.g., springs, may be employed to provide such resiliency.

The above description and drawings are only illustrative of one embodiment which achieves the objects, features and advantages of the present invention and it is not intended that the present invention be limited thereto. Any modifications of the present invention which come within the spirit and scope of the following claims are considered part of the present invention.

What is claimed as new and desired to be secured by Letters Patent of the United States is:

1. An integral front plate and latching mechanism for latching a circuit board module to a mounting rack positioned below the circuit board, the integral front plate and latching mechanism comprising:
   a front wall;
   a side wall which extends in a first direction defining a rearwardly direction from said front wall and which includes means for attaching a circuit board to said side wall for orientation of the circuit board rearwardly of and perpendicular to said front wall;
   a portion of said front wall which portion extends in a direction defining a downwardly direction beyond said side wall for disposition thereof lower than said side wall and the circuit board;
   a latch block which extends in a second direction defining a forwardly direction from said front wall portion;
   a resilient tab extending rearwardly from a forward edge portion of said latch block for deflection of said tab;
   a prong including a shaft which extends rearwardly of said tab and which terminates in a portion defining an head having a shoulder forwardly thereof for engaging a latch aperture in the mounting rack.

2. Apparatus as in claim 1 wherein said tab extends rearwardly from a lower edge of said latch block and below said latch block to allow gripping of said latch block and said tab for upward deflection of said tab.

3. Apparatus as in claim 1 wherein with the circuit board module fully inserted in the rack said shaft of said prong extends through said aperture and said shoulder engages said rack to preclude withdrawal of the circuit board module from the fully inserted position in said rack.

4. Apparatus as in claim 3 wherein said head is tapered and has a point aligned with said aperture such that during insertion of module into the rack the point penetrates the aperture and the rack bears upon the tapered head against the face extended by said resilient tab to deflect it through the aperture.

5. A latching mechanism as in claim 1 further comprising a plurality of treads and an upper lip on the upper surface of said latch block and a second plurality of treads and a lower lip on the lower surface of said tab to provide finger holds for withdrawal of the module from the rack.

6. A device as in claim 1 integrally molded in a single piece from a single material.

7. A device as in claim 6 wherein said material is a polycarbonate resin.

8. A dismountable circuit board rack comprising:
   at least one circuit board;
   a mounting rack disposed lower than said circuit board and including means defining a latch aperture;
   a front plate including a front wall and a side wall, said side wall extending from said front wall in a first direction defining a rearwardly direction to said circuit board and attached to said circuit board to provide a circuit board module wherein said circuit board is oriented rearwardly of and perpendicular to said front wall;
   a lower portion of said front wall which portion is disposed lower than said side wall and said circuit board;
   a latch block which extends in a second direction defining a forwardly direction from said front wall portion;
   a resilient tab extending rearwardly from a forward edge portion of said latch block for deflection of said tab; and
   a prong including a shaft which extends rearwardly of said tab and which terminates in a portion defining an head having a shoulder forwardly thereof for engaging said latch aperture to latch said circuit board module to said mounting rack.

9. Apparatus as in claim 8 wherein said tab extends rearwardly from a lower edge of said latch block and below said latch block to allow gripping of said latch block and said tab for upward deflection of said tab.

10. An integral front plate and latching mechanism for a circuit board module slidably disposed in a mounting rack having a latch aperture comprising:
    a generally rectangular front wall;
    a side wall extending in a first direction defining a rearwardly direction from one edge of said front wall and including means for attachment of the circuit board for orientation of the circuit board rearwardly of and perpendicular to said front wall;
    an upper gusset and a lower gusset affixed to and bracing the intersection of said front wall and said side wall at the upper and lower portions respectively thereof;
    said front wall having an upper portion extending above said upper gusset and a lower portion extending below said lower gusset;
    a latch block being substantially hollow in the transverse direction and extending in a second direction defining a forwardly direction from substantially all of said front wall lower portion;
    a latch block gusset affixed in and bracing said latch block;
    a resilient tab extending from a front lower edge of said latch block rearwardly and spaced below said latch block to allow upward deflection of said tab;
    a prong having a shaft which extends rearwardly from said tab and which terminates in a portion defining an head having a shoulder forwardly thereof, the shoulder extending lower than said shaft for engaging the latch aperture.

11. A method for latching and unlatching to and from a mounting rack a circuit board module having a module front plate and being slidably disposed in the mounting rack having a latch aperture comprising the steps of:
    providing a finger hold on a lower portion of the module front plate which finger hold extends from the module front plate in a direction away from the circuit board defining a forwardly direction;
    providing a resilient tab integrally connected with the finger hold and extending in a direction toward the circuit board defining a rearwardly direction;
    providing a prong including a shaft extending rearwardly from the resilient tab and terminating in a portion defining an head having a shoulder forwardly thereof;

deflecting said resilient tab to align said head with said aperture;
fully inserting the circuit board module in the rack and said head of said prong through the aperture;
releasing said resilient tab to allow said shoulder to engage said rack to preclude withdrawal of said module therefrom;
gripping said finger hold and said resilient tab to deflect said resilient tab toward said finger hold to align said head with said aperture; and
withdrawing said head of said prong through the aperture and the circuit board module from the rack.

* * * * *